US008399778B2

(12) United States Patent
Hsu

(10) Patent No.: US 8,399,778 B2
(45) Date of Patent: Mar. 19, 2013

(54) CIRCUIT BOARD STRUCTURE AND FABRICATION METHOD THEREOF

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 1361 days.

(21) Appl. No.: 12/047,868

(22) Filed: Mar. 13, 2008

(65) Prior Publication Data
US 2009/0065245 A1 Mar. 12, 2009

(51) Int. Cl.
*H05K 1/16* (2006.01)
(52) U.S. Cl. ........................................ 174/260; 174/255
(58) Field of Classification Search .................... None
See application file for complete search history.

(56) References Cited

U.S. PATENT DOCUMENTS

| | | | | |
|---|---|---|---|---|
| 4,931,853 A * | 6/1990 | Ohuchi et al. | ................ | 257/679 |
| 5,147,982 A * | 9/1992 | Steffen | ......................... | 174/521 |
| 5,745,984 A * | 5/1998 | Cole et al. | ....................... | 29/834 |
| 6,423,570 B1 * | 7/2002 | Ma et al. | ....................... | 438/106 |
| 6,555,906 B2 * | 4/2003 | Towle et al. | .................. | 257/723 |
| 7,839,649 B2 * | 11/2010 | Hsu | ................................ | 361/761 |
| 7,893,360 B2 * | 2/2011 | Sakamoto et al. | ............ | 174/260 |
| 7,943,855 B2 * | 5/2011 | Cheng et al. | .................. | 174/252 |
| 2005/0017347 A1 * | 1/2005 | Morimoto et al. | ............ | 257/703 |
| 2006/0263936 A1 * | 11/2006 | Hsu | ............................... | 438/108 |

* cited by examiner

Primary Examiner — Ishwarbhai Patel
(74) Attorney, Agent, or Firm — Pearne & Gordon LLP

(57) ABSTRACT

A circuit board structure and a fabrication method thereof are disclosed. The circuit board structure includes a carrying board having a first and an opposite second surface and having at least one through cavity formed therein; a semiconductor chip disposed in the through cavity of the carrying board; an adhesive material filling the gap between the through cavity of the carrying board and the semiconductor chip to fix the semiconductor chip in the through cavity; and a reinforcing layer disposed on the second surface of the carrying board and the inactive surface of the semiconductor chip, thereby increasing the strength of the carrying board as well as the reliability of the circuit board.

4 Claims, 4 Drawing Sheets

CIRCUIT BOARD STRUCTURE AND FABRICATION METHOD THEREOF

FIELD OF THE INVENTION

The present invention relates to circuit board structures and fabrication methods thereof, and more particularly, to a reinforced circuit board structure with a semiconductor chip embedded therein and a fabrication method thereof.

BACKGROUND OF THE INVENTION

As the electronic industry continues to boom, the trend in the development of electronic products is heading in the direction of small size but with high performance, high functionality and high speed. In order to satisfy the requirements of high integration and miniaturization for semiconductor devices, a circuit board provided with a plurality of active/passive components and circuits is developed from a double-layer structure to a multi-layer circuit board. This is achieved by employing the interlayer connection technique to enlarge the usable area of a circuit board with limited space, so that integrated circuits of high wiring density can be incorporated to meet the development trend of miniaturization, high capacity, and high speed of the electronic products.

The circuit board manufacturing industry is ceaselessly pursuing the goals of low cost, high reliability, and high circuit density. To achieve the goals, the industry has developed a "build-up" technique; this technique stacks multiple dielectric layers and circuit layers on the surface of a core circuit board, and forms conductive vias or plated through holes (PTHs) in the dielectric layers to electrically connect the circuit layers. During a circuit build-up process, unbalanced thermal stresses resulted form the difference of the CTEs (coefficient of thermal expansion) can lead to warpage. Generally, to prevent the above problems, a build-up process is performed on both the top and bottom surfaces of the core board, such that a symmetrical built-up structure is formed to prevent warpage.

Given a big difference among CTEs of the conductive traces made of metal, insulating layer, and solder mask layer, warpage occurs to the substrate as a result of a temperature change. Besides, the circuit layouts of the top and bottom surfaces of the core board differ from each other in general, depending on the desired functions. Therefore, different thermal stresses result from the circuit density difference between the circuit layers of the top and bottom surfaces of the core board while temperature changes in fabricating processes such as baking, encapsulant curing, and heat laminating. As a result, unbalanced stresses can lead to warpage, and even lead to delamination.

Furthermore, owing to the blooming development of various portable devices in the field of communication, networking and computing, there have been provided different types of packages such as ball grid array (BGA) package, flip chip package, chip size package (CSP), and multi-chip module (MCM), which are characterized with high density and multiple leads, and have become mainstream products on the semiconductor market. Further, a core structure with semiconductor chip embedded therein has been developed.

FIGS. 1A to 1E are schematic flow charts showing the stepwise processes for embedding a semiconductor chip within a core board structure using prior-art.

Referring to FIG. 1A, a core board 11 having a first surface 11a and an opposite second surface 11b and having a through cavity 110 penetrating the first and the second surface 11a, 11b is provided. A release film 12 is formed on the second surface 11b of the core board 11 to seal one terminal of the through cavity 110.

Referring to FIG. 1B, a semiconductor chip 13 is mounted within the through cavity 110 of the core board 11, wherein the semiconductor chip 13 having an active surface 13a and an opposite inactive surface 13b. The active surface 13a has a plurality of electrode pads 131. The semiconductor chip 13 is mounted on the surface of the release film 12 within the through cavity 110 via the inactive surface 13b.

Referring to FIG. 1C, an adhesive material 14 fills the gap between the through cavity 110 of the core board 11 and the semiconductor chip 13 to fix the semiconductor chip 13 in the through cavity 110.

Referring to FIG. 1D, the release film 12 is removed.

Referring to FIG. 1E, a built-up structure 15 is formed on the first surface 11a of the core board 11 and the active surface 13a of the semiconductor chip 13, wherein the built-up structure 15 comprising a dielectric layer 151, a circuit layer 152 stacked on the dielectric layer 151, and a plurality of conductive vias 153 formed in the dielectric layer 151. The conductive vias 153 electrically connect to the electrode pads 131 of the semiconductor chip 13. The outmost circuit layer 152 further comprises a plurality of conductive pads 154. Further, a solder mask layer 16 is formed on the outer surface of the built-up structure 15, wherein the solder mask layer 16 has a plurality of openings 160, to thereby expose the conductive pads 154.

Accordingly, to meet the demand of the circuit design, the built-up structure 15 is formed merely on the first surface 11a of the core board 11, so that unbalanced stresses between the opposite surfaces of the package structure can lead to warpage or delamination during fabricating process, and affect the reliability and quality consequentially. Furthermore, the number of laminated layers of the built-up structure 15 is limited by the warpage problem, and accordingly hinder the development of high integration and miniaturization for semiconductor package.

Therefore, there exists a strong need in the art for a circuit board structure to overcome the drawbacks of poor anti-bending strength of the foregoing conventional circuit board structure.

SUMMARY OF THE INVENTION

In light of the foregoing drawbacks of the prior art, a primary objective of the present invention is to provide a circuit board structure and a fabrication method thereof that is capable of increasing the strength of the circuit board with semiconductor chip embedded therein, thereby avoiding warpage or delamination caused by unbalanced stresses of the asymmetric built-up structure.

Another objective of the present invention is to provide a circuit board structure and a fabrication method thereof that is capable of reducing warpage or delamination of the circuit board structure caused by different CTEs between materials during the manufacturing process.

A further objective of the present invention is to provide a circuit board structure and a fabrication method thereof, to thereby avoid damages of the semiconductor chip embedded therein caused by unbalanced stresses of the circuit board.

In order to achieve the above and other objectives, the present invention discloses a fabrication method of a circuit board structure that comprises the steps of: providing a carrying board having a first and an opposite second surface and having at least one through cavity formed therein; disposing a semiconductor chip in the through cavity of the carrying board, wherein the semiconductor chip has an active surface and an opposite inactive surface, and the active surface has a plurality of electrode pads thereon; filling with an adhesive material in the gap between the through cavity of the carrying board and the semiconductor chip to fix the semiconductor chip in the through cavity; and forming a reinforcing layer on the second surface of the carrying board and the inactive surface of the semiconductor chip, wherein the reinforcing layer is made of a thermoplastic resin. An opening can further be formed in the reinforcing layer to expose the inactive surface of the semiconductor chip, to thereby increase the heat dissipation capability of the semiconductor chip.

The carrying board is selected from the group consisting of a metal board, a ceramic board, and an insulating board, and the insulating board is selected from the group consisting of epoxy resin, polyimide, cyanate ester, FR4, FR5, glass fiber, bismaleimide triazine (BT), and a mixed glass fiber and epoxy resin. The adhesive material is an adhesive resin or a prepreg material.

The above fabrication method further comprises the step of forming a built-up structure on the first surface of the carrying board and the active surface of the semiconductor chip, wherein the built-up structure comprises at least one dielectric layer, at least one circuit layer stacked on the dielectric layer, and a plurality of conductive vias formed in the dielectric layer. A portion of the conductive vias electrically connect to the electrode pads of the semiconductor chip. The outmost circuit layer further comprises a plurality of conductive pads. A solder mask layer is formed on the outer surface of the built-up structure, wherein the solder mask layer has a plurality of openings for exposing the conductive pads.

The present invention further discloses a circuit board structure, which comprises: a carrying board having a first and an opposite second surface and having at least one through cavity formed therein; at least one semiconductor chip disposed in the through cavity of the carrying board, wherein the semiconductor chip has an active surface and an opposite inactive surface, and the active surface has a plurality of electrode pads thereon; an adhesive material filling the gap between the through cavity of the carrying board and the semiconductor chip to fix the semiconductor chip in the through cavity; and a reinforcing layer disposed on the second surface of the carrying board and the inactive surface of the semiconductor chip, wherein the reinforcing layer is made of a thermoplastic resin. An opening can further be disposed in the reinforcing layer to expose the inactive surface of the semiconductor chip and thereby increase the heat dissipation capability of the semiconductor chip.

The carrying board is selected from the group consisting of a metal board, a ceramic board, and an insulating board, and the insulating board is selected from the group consisting of epoxy resin, polyimide, cyanate ester, FR4, FR5, glass fiber, bismaleimide triazine (BT), and a mixed glass fiber and epoxy resin. The adhesive material is an adhesive resin or a prepreg material.

The above structure further comprises a built-up structure disposed on the first surface of the carrying board and the active surface of the semiconductor chip, wherein the built-up structure comprises at least one dielectric layer, at least one circuit layer stacked on the dielectric layer, and a plurality of conductive vias disposed in the dielectric layer. A portion of the conductive vias electrically connect to the electrode pads of the semiconductor chip. The outmost circuit layer further comprises a plurality of conductive pads. A solder mask layer is disposed on the outer surface of the built-up structure, wherein the solder mask layer has a plurality of openings for exposing the conductive pads Therefore, a reinforcing layer made of a thermoplastic resin is bonded to the carrying board of the present invention, to thereby increase the strength of the carrying board. The carrying board is a metal board, a ceramic board, an insulating board, or a combination thereof, and formed as a composite structure to increase strength of the overall structure, thereby warpage or delamination of the circuit board structure or the damages of the semiconductor chip caused by different CTEs between materials or the unbalanced stresses of the asymmetric built-up structure during the subsequent manufacturing process is avoid. As a result, the reliability of the circuit board structure, and lamination of more layers can be accomplished.

BRIEF DESCRIPTION OF THE DRAWINGS

The present invention can be more fully understood by reading the following detailed description of the preferred embodiments, with reference made to the accompanying drawings, wherein:

FIG. 2D' is another schematic cross-sectional view of the FIG. 2D.

DETAILED DESCRIPTION OF THE PREFERRED EMBODIMENTS

The following specific embodiments are provided to illustrate the present invention. Other skilled in the art can readily gain an insight in other advantages and features of the present invention based on the contents disclosed in this specification.

FIGS. 2A to 2D are schematic cross-sectional views showing the fabrication method of the circuit board structure according to the present invention.

Figure 1A:
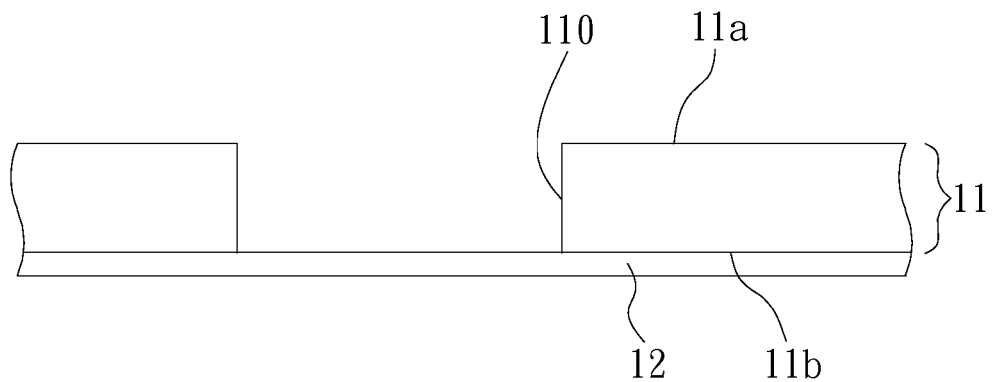
FIGS. 1A to 1E (PRIOR ART) are schematic cross-sectional views showing the stepwise processes for fabricating a known circuit board structure with a semiconductor chip embedded therein.
Figure 1B:
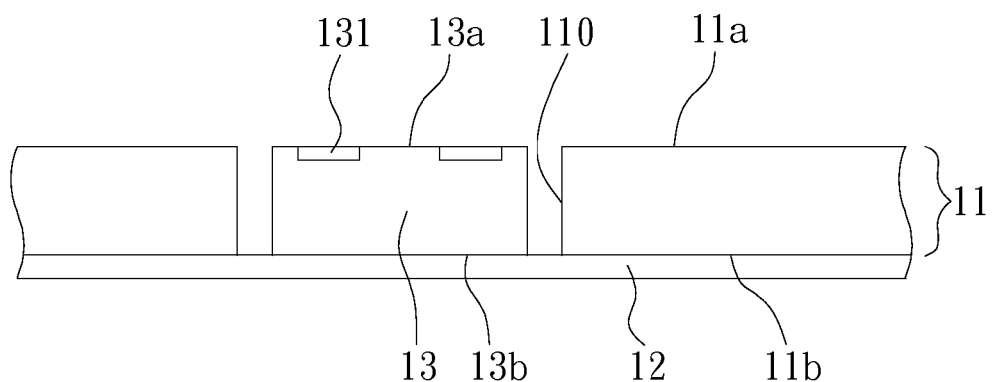
Figure 1C:
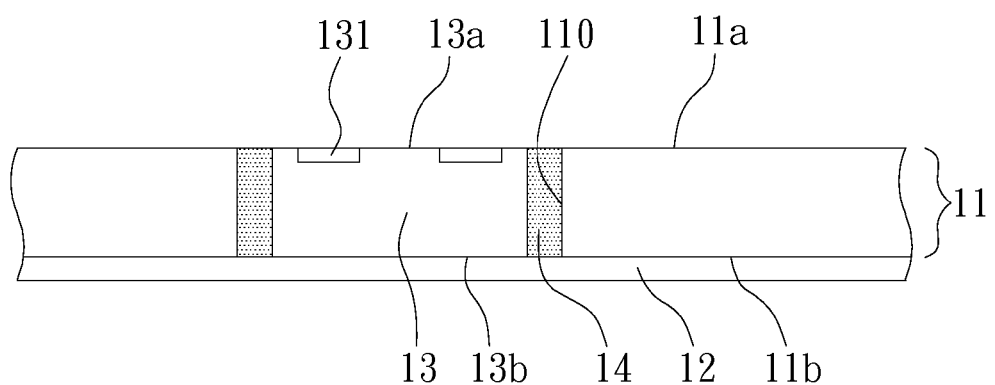
Figure 1D:
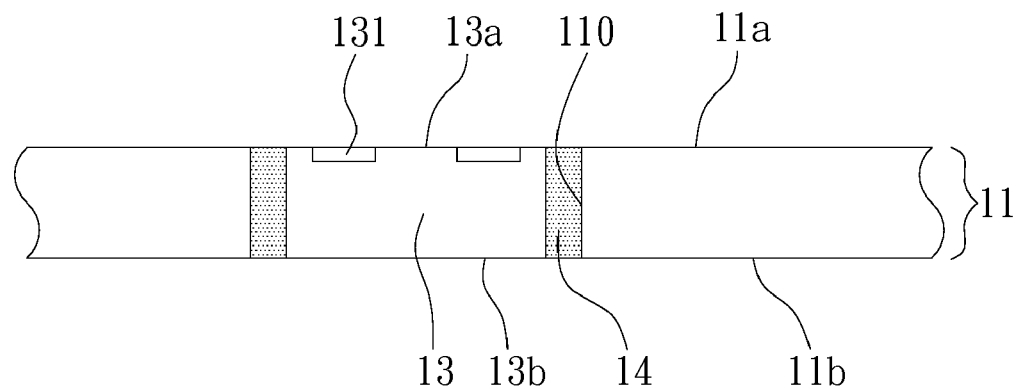
Figure 1E:
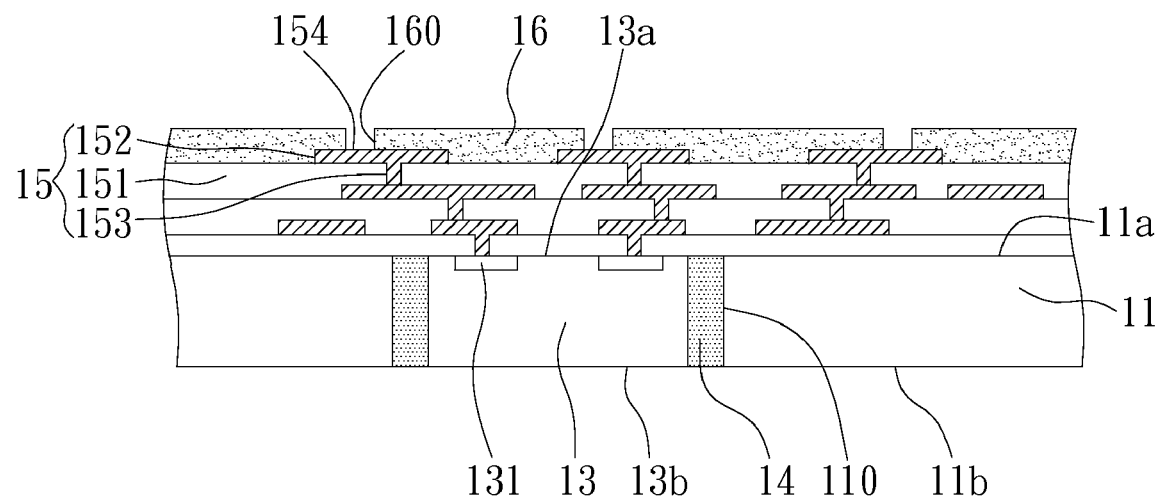
Figure 2A:
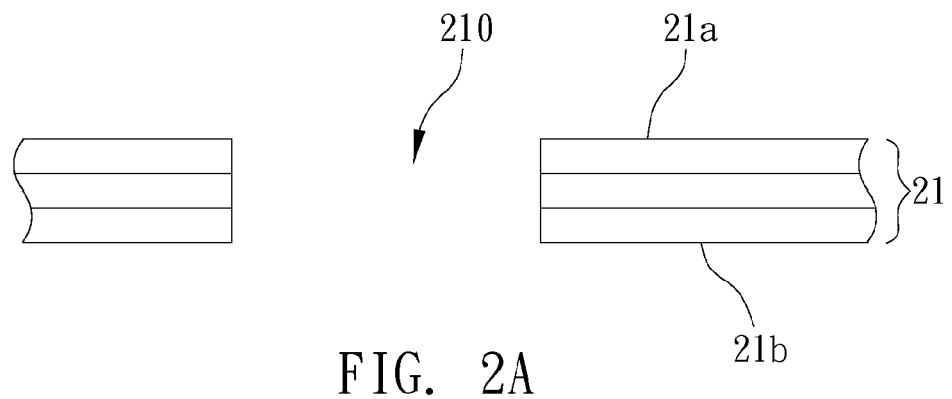
FIGS. 2A to 2D are schematic cross-sectional views showing the circuit board structure and the fabrication method thereof according to the present invention.

Referring to FIG. 2A, a carrying board 21 formed by laminating at least two boards is provided, wherein each of the boards is a metal board, a ceramic board, or an insulating board. The carrying board 21 has a first surface 21a and an opposite second surface 21b and has at least one through cavity formed therein 210 penetrating the first surface 21a and the second surface 21b. The insulating board is selected from the group consisting of epoxy resin, polyimide, cyanate ester, FR4, FR5, glass fiber, bismaleimide triazine (BT), and a mixture of glass fiber and epoxy resin.

Figure 2B:
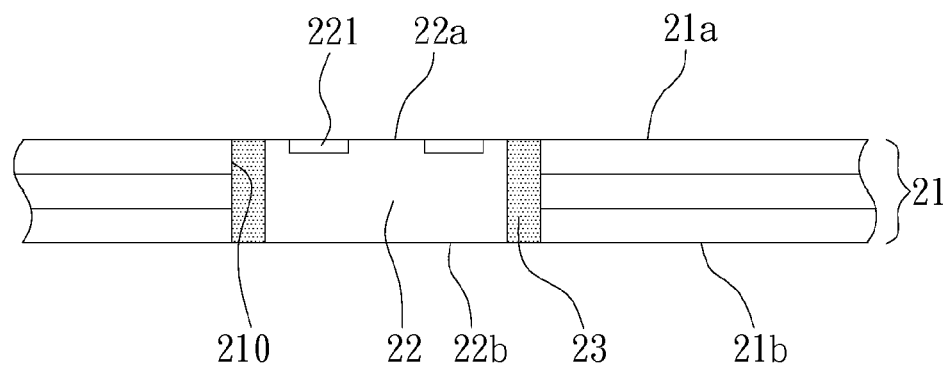

Referring to FIG. 2B, a semiconductor chip 22 is placed in the through cavity 210 of the carrying board 21, wherein the semiconductor chip 22 has an active surface 22a and an opposite inactive surface 22b, and the active surface 22a has a plurality of electrode pads 221 thereon. The active surface 22a of the semiconductor chip 22 is at the same side with the first surface 21a of the carrying board 21. Then, the gap between the through cavity 210 and the semiconductor chip 22 is filled with an adhesive material 23 to fix the semiconductor chip 22 in the through cavity 210, wherein the adhesive material 23 is an adhesive resin or a prepreg material.

Figure 2C:
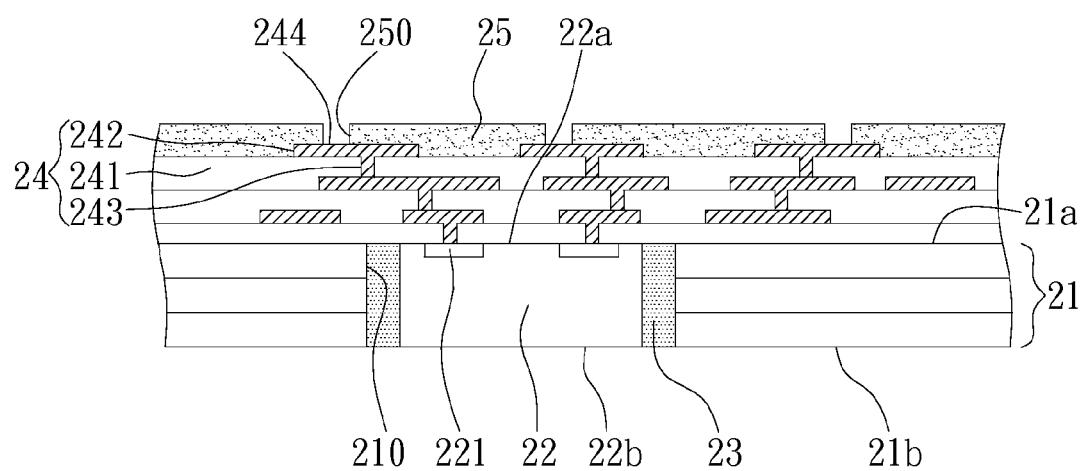

Referring to FIG. 2C, a built-up structure 24 is formed on the first surface 21a of the carrying board 21 and the active surface 22a of the semiconductor chip 22, wherein the built-up structure 24 comprises at least one dielectric layer 241, at least one circuit layer 242 stacked on the dielectric layer 241, and a plurality of conductive vias 243 formed in the dielectric layer 241. A portion of the conductive vias 243 electrically connect to the electrode pads 221 of the semiconductor chip 22. The built-up structure 24 further comprises a plurality of conductive pads 244 on the outer surface of the built-up structure 24. Further, a solder mask layer 25 is formed on the outer surface of the built-up structure 24, wherein a plurality of openings 250 are formed in the solder mask layer 25 to expose the conductive pads 244.

Figure 2D:
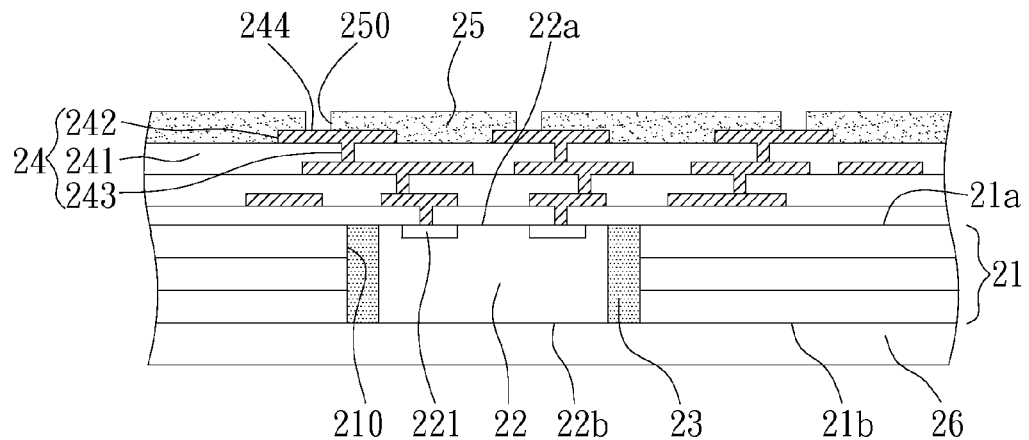
Figure 2D:
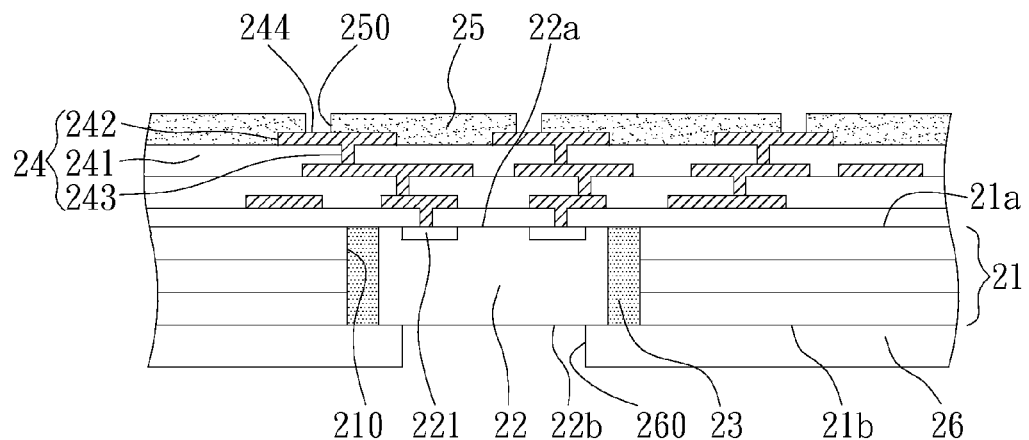

Referring to FIG. 2D, a reinforcing layer 26 made of a thermoplastic resin is formed on the second surface 21b of the carrying board 21 and the inactive surface 22b of the semiconductor chip 22 by coating or laminating, thereby increasing the rigidity of the carrying board 21 so as to prevent the built-up structure 24 and the carrying board 21 from warpage and delamination.

Referring to FIG. 2D', an opening 260 is further formed in the reinforcing layer 26 to expose the inactive surface 22b of the semiconductor chip 22, so as to increase the heat dissipation capability of the semiconductor chip 22.

The present invention further provides a circuit board structure, which comprises: a carrying board 21 having a first surface 21a and an opposite second surface 21b and having at least one through cavity formed therein 210 penetrating the first surface 21a and the second surface 21b; at least one semiconductor chip 22 disposed in the through cavity 210 of the carrying board 21, wherein the semiconductor chip 22 has an active surface 22a and an opposite inactive surface 22b, and the active surface 22a has a plurality of electrode pads 221 thereon; an adhesive material 23 filling the gap between the through cavity 210 of the carrying board 21 and the semiconductor chip 22 to fix the semiconductor chip 22 in the through cavity 210; and a reinforcing layer 26 made of a thermoplastic resin and disposed on the second surface 21b of the carrying board 21 and the inactive surface 22b of the semiconductor chip 22, wherein an opening 260 is further disposed in the reinforcing layer 26 to expose the inactive surface 22b of the semiconductor chip 22, to thereby increase the heat dissipation capability of the semiconductor chip 22.

The above structure further comprises a built-up structure 24 disposed on the first surface 21a of the carrying board 21 and the active surface 22a of the semiconductor chip 22, wherein the built-up structure 24 comprises at least one dielectric layer 241, at least one circuit layer 242 stacked on the dielectric layer 241, and a plurality of conductive vias 243 disposed in the dielectric layer 241. A portion of the conductive vias 243 electrically connect to the electrode pads 221 of the semiconductor chip 22. The outmost circuit layer 242 further comprises a plurality of conductive pads 244. A solder mask layer 25 is disposed on the outer surface of the built-up structure 24, wherein the solder mask layer 25 has a plurality of openings 250 for exposing the conductive pads 244.

According to the circuit board structure and the fabrication method thereof of the present invention, the semiconductor chip is fixed in the through cavity of the carrying board by an adhesive material, and then a built-up structure 24 is formed on the first surface of the carrying board and the active surface of the semiconductor chip. Sequentially, a reinforcing layer is formed on the second surface of the carrying board and the inactive surface of the semiconductor chip, thereby increasing the rigidity of the carrying board. The carrying board is a metal board, a ceramic board, an insulating board, or a combination thereof, and formed as a composite structure to increase the strength of the overall structure, thereby avoiding warpage or delamination of the circuit board structure or the damages of the semiconductor chip which might otherwise arise from different CTEs between materials or the unbalanced stresses of the asymmetric built-up structure during the subsequent manufacturing process. As a result, the reliability of the circuit board structure is increased, and lamination of more layers can be accomplished.

The present invention has been described using exemplary preferred embodiments above, however, it is to be understood that the scope of the present invention is not limited to the disclosed embodiments. On the contrary, it is intended to cover various modifications and similar changes. It will be apparent to those skilled in the art that any equivalent modifications or changes made, without departing from the spirit and the technical concepts disclosed by the present invention, should fall within the scope of the appended claims.

What is claimed is:

1. A circuit board structure, comprising:
   a carrying board having a first and an opposite second surface and having at least one through cavity formed therein;
   at least one semiconductor chip disposed in the through cavity of the carrying board, wherein the semiconductor chip is embedded in the carrying board and has an active surface and an opposite inactive surface, and wherein the active surface has a plurality of electrode pads thereon, and the inactive surface is flush with the second surface of the carrying board;
   an adhesive material filling a gap between the through cavity of the carrying board and the semiconductor chip to fix in position the semiconductor chip in the through cavity, wherein the adhesive material is different from a material of the carrying board; and
   a reinforcing layer disposed on the second surface of the carrying board and the inactive surface of the semiconductor chip, wherein the reinforcing layer is made of a thermoplastic resin, and a material of the thermoplastic resin is different from the adhesive material, and wherein the reinforcing layer has an opening to expose the inactive surface of the semiconductor chip, and one end of the opening is completely covered by the inactive surface.

2. The circuit board structure of claim 1, wherein the carrying board is selected from the group consisting of a metal board, a ceramic board, and an insulating board.

3. The circuit board structure of claim 1, wherein the adhesive material is one of an adhesive resin and a prepreg material.

4. The circuit board structure of claim 1, further comprising a built-up structure disposed on the first surface of the carrying board and the active surface of the semiconductor chip, wherein the built-up structure comprises at least one dielectric layer, at least one circuit layer, a plurality of conductive pads, and a plurality of conductive vias, and a portion of the conductive vias electrically connect to the electrode pads of the semiconductor chip.

* * * * *